United States Patent

Suzuki

[11] Patent Number: 6,163,875
[45] Date of Patent: Dec. 19, 2000

[54] SEMICONDUCTOR TESTING EQUIPMENT

[75] Inventor: Noriyuki Suzuki, Tokyo, Japan

[73] Assignee: Ando Electric Co., Ltd., Tokyo, Japan

[21] Appl. No.: 09/063,640

[22] Filed: Apr. 21, 1998

[30] Foreign Application Priority Data

Apr. 25, 1997 [JP] Japan ................................. 9-109865

[51] Int. Cl.$^7$ ........................... G06F 17/50; G01R 31/28
[52] U.S. Cl. .............................................. 716/4; 371/22.1
[58] Field of Search ...................... 375/500.03; 371/22.1; 716/4

[56] References Cited

U.S. PATENT DOCUMENTS

| | | | |
|---|---|---|---|
| 5,475,815 | 12/1995 | Byers et al. | 395/183.08 |
| 5,610,925 | 3/1997 | Takahashi | 371/22.1 |
| 5,668,819 | 9/1997 | Fukushima | 371/25.1 |
| 5,963,566 | 10/1999 | Rajsuman et al. | 371/22.5 |

Primary Examiner—Kevin J. Teska
Assistant Examiner—Hugh Jones
Attorney, Agent, or Firm—Fish & Richardson, P.C.

[57] ABSTRACT

Semiconductor testing equipment for the present invention includes a command pattern matching circuit 29, a timer circuit 17, an AND circuit 23 which ANDs acceptable product decision signal for inspecting decision change points for a device while being tested, and an OR circuit 24 for ORing the output signal of the timer 17 and the AND circuit 23. It also includes a pattern sequence control circuit 28 for changing the pattern sequence control operation upon receipt of the output signal of this OR circuit 24. The semiconductor testing equipment 1 monitors the changes in the outputs of the pins for all the devices under test 3, 3, . . . being simultaneously tested, detects acceptable products signals for the devices, when executing a specified mode processing of devices under test 3, 3, . . . , ends decision processing in the shortest time, and when the same decision process is repeated more than twice, invalidates the decision for the known defective devices under test 3, 3, . . . in the first processing, reduces the decision processing time and significantly reduces the testing time.

2 Claims, 4 Drawing Sheets

SEMICONDUCTOR TESTING EQUIPMENT

BACKGROUND OF THE INVENTION

1. Field of the Invention

The present invention relates to semiconductor testing equipment which simultaneously conducts burn-in testing on a plurality of integrated circuits.

This Application is based on Japanese Patent Application No. Hei 9-109865, the contents of which are incorporated herein by reference.

2. Background Art

In recent years, the demand for integrated circuits has increased significantly. Enhancing the processing capability of equipment for testing the characteristics of semiconductor integrated circuits is desirable. In particular, it is desirable to be able to test a large number of integrated circuits simultaneously.

In conventional semiconductor testing equipment, a fixed period of time is typically required for testing a large number of integrated circuits. In such systems, the number of integrated circuits processed per unit time can not be increased. For example, for flash memory integrated circuits and the like, a decision regarding the results of the testing takes a long time because the results are not obtained until testing is completed for all the devices under test.

SUMMARY

Semiconductor testing equipment for testing integrated circuits includes a timer that is set to a specified time interval and comparison circuits for each of the integrated circuits. Each comparison circuit compares first data stored in advance as an expected value and second data output from a respective one of the integrated circuits, and outputs a comparison signal based on the comparison. A decision timing circuit detects either when the specified time interval has elapsed or when all the comparison signals indicate that the integrated circuits are acceptable products before the specified time interval has elapsed, and uses this timing as the decision timing. Decision circuits perform data processing of the comparison signals at the decision timing.

The equipment can be used, for example, to test integrated circuits in a high temperature vessel with an adjustable ambient temperature. The equipment can help reduce the time required for burn-in testing of the integrated circuits.

Other features and advantages will be apparent from the detailed description, the accompanying drawings and the claims.

BRIEF DESCRIPTION OF THE DRAWINGS

The present invention will be described in detail with reference to the accompanying drawings, in which.

DETAILED DESCRIPTION OF THE PREFERRED EMBODIMENT

A preferred embodiment of the present invention will be described with reference to the drawings attached herewith.

Figure 1:
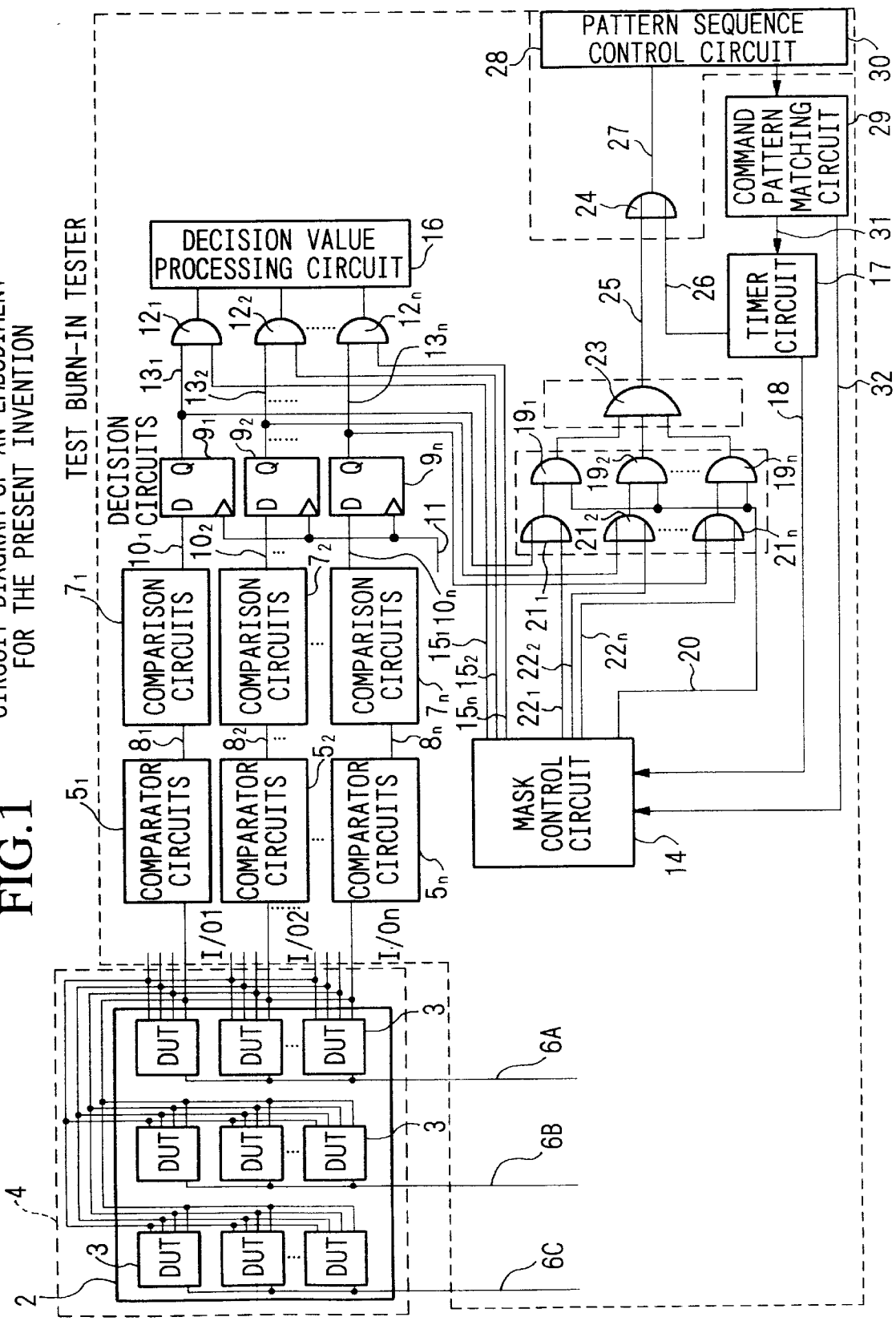
FIG. 1 is a block diagram showing the configuration of the semiconductor testing equipment according to a preferred embodiment of the present invention.

FIG. 1 is a block diagram showing the circuit configuration of the semiconductor testing equipment for conducting a burn-in test with respect to a large quantity of integrated circuits. In this figure, 1 is a semiconductor testing equipment, and a testing is conducted by placing a plurality of devices under test 3, 3, . . . in a thermostat, on a mount board for device under test 2, under a prescribed environment. The thermostat 4 is a vessel which is capable of arbitrarily changing the inside temperature.

Signals on scanning signal lines 6A, 6B, 6C are provided to the DUTs 3 and are used to select DUTs whose output signals I/O1, I/O2, . . . I/On are to be sent to comparator circuits 51, 52, . . . 5n. For example, DUTs 3 that receive a scanning signal with a value of '1' send output signals to the comparator circuits 51, 52, . . . 5n. Here the scanning signals 6A, 6B and 6C do not go to '1' at the same time, but only one of the scanning signals goes to '1' and the other signals go to '0'.

The comparator circuit 51 is connected to a comparison circuit 71 via a signal line, conducts deciding of the voltage level of the signal I/O1 and outputs a value of '0' or '1' of a signal 81 as the result of level decision to the comparison circuit.

In addition, comparator circuits 52 to 5n, similarly to the aforementioned section, are connected to respective comparison circuits 72 to 7n.

Furthermore, the comparator circuits 52 to 5n conduct deciding of the voltage level of the signal I/O2 to the signal I/On, the data of the signals 82 to 8n either '0' or '1' is respectively output to the comparison circuits 72 to 7n, as the result of level decision.

The comparison circuit 71 is connected to a decision circuit 91 via a signal line, performs a comparison between a previously-stored value and the value of the signal 81, and outputs the comparison result as a signal 101 to the decision circuit 91.

Then, for example, in the comparison result, when the value which has been previously set agrees with the value of the signal 81, the value of the signal 81 goes to '1'. Also in the comparison result, when the value which has been previously set does not agree with the value of the signal 81, the value of the signal 101 goes to '0'.

Similarly, the respective comparison circuits 72 to 7n are connected to the decision circuits 92 to 9n respectively via the respective line wires. Furthermore, the respective comparison circuits 72 to 7n conduct comparison between previously-stored values and the respective values of the signals 82 to 8n and outputs the respective values of the signals 92 to 9n to the signals 102 to 10n via signal wires.

In the decision circuit 91, a trigger signal 11 for deciding from a pulse generator, not shown in FIG. 1, is input and stores the data of the signal 101 with a timing, for example where the value of the decision trigger signal 11 changes from '0' to '1'. Furthermore, the decision circuit 91 is connected to an AND circuit 121 of two inputs via a signal line, and outputs the data of the signal 101 which is stored in itself to the AND circuit 121.

Similarly, for example, when the trigger signal 11 for decision changes from '0' to '1', the data for respective signals 102 to 10n are stored in each of the decision circuits 92 to 9n.

Further, the deciding circuits 92 to 9n are connected to the two-input input terminals of AND circuits 122 to 12n, and outputs the data of the respective signals 102 to 10n which are respectively stored inside as signals 132 to 13n, to respective AND circuits 122 to 12n.

In the AND circuit 121, other input terminals are connected to a mask control circuit 14 via a signal line, and the output terminals are connected to a decision value processing circuit 16. Here, the AND circuit 121 outputs the ANDed values of the data of a signal 131 and the data of signal 151 to the decision value processing circuit 16.

Similarly, for the AND circuits 122 to 12n, while respective other input terminals are connected to the mask control circuit 14 via the signal lines, respective output terminals are connected to the decision value processing circuit 16. Then, the AND circuits 122 to 12n output the logical product between respective data of signals 132 to 13n and signals 152 to 15n (masking signals 1).

The decision value processing circuit 16 records data of the test results and sums the data of the test results for the DUTs 3.

The mask control circuit 14 is connected to a timer circuit 17 via a signal line, and when the data of a signal 18 (timer start signal) goes to '1', the mask control circuit 14 outputs the signals 151 to 15n as '0'. At the same time, the mask circuit 14 outputs a signal 20 as '0' data to one of the input terminals of each two-input AND circuits 191 to 19n.

The other input terminals of the AND circuits 191 to 19n are connected to output terminals of respective two-input OR circuits 211 to 21n. Here, the AND circuits 191 to 19n output the ANDed values of the data output from the respective output terminals of OR circuits 211 to 21n and the data of signal 20 to the respective input terminals of AND circuit 23.

Each of the OR circuits 211 to 21n has signals 131 to 13n input to the respective one input terminals and have each of the signals 221 to 22n input from the mask circuit 14 to the other input terminals. Here, the mask control circuit 14 outputs signals 221 to 22n having a level '1' to those OR circuits 211, 212, . . . 21n that correspond to DUTs that were determined to be defective.

Furthermore, each of the OR circuits 211 to 21n outputs to the input terminals of each AND circuits 191 to 19n the results of the ORed values of the data of signals 131 to 13n and the data of signals 221 to 22n.

23 is an n-input AND circuit each of the input terminals of which are connected to the output terminals of each AND circuits 191 to 19n, and the output terminals are connected to one input terminal of a two-input OR circuit 24 via a signal wire. Furthermore, the AND circuit 23 outputs the result data of the ANDed values of the output signals of the AND circuits 191 to 19n as a signal 25 to the OR circuit 24.

The OR circuit 24 has the other input terminal connected to the timer circuit 17 via a signal wire, and the output terminal connected to a pattern sequence circuit 28 via a signal line. Furthermore, the OR circuit 24 outputs the result of the ORed values of the data of signal 25 which the AND circuit 23 outputs and the data of signal 26 (timer end signal) which the timer 17 outputs as a signal 27 to the pattern sequence circuit 28.

The pattern sequence control circuit 28 is connected to a command pattern matching circuit 29 via a signals line. When the value of the signal 27 changes to '1', the command sequence control circuit 28 outputs a signal 30 to the command pattern matching circuit 29 and outputs a signal 32 that controls the mask control circuit 14.

The command pattern matching circuit 29, when the data of the signal 30 and the data of a control signal, not shown in the figure, match the scanning signals 6A, 6B, or 6C of the pattern sequence control circuit 28, for example outputs a signal 31 (timer start command) as data '1' and outputs a signal 32 as data '0'.

Furthermore, when the data of the signal 30 which the pattern sequence control circuit 28 outputs do not match the data of the control signal, not shown in the figure, with a timing of the scanning signals 6A, 6B, or 6C, the command pattern matching circuit 29 outputs the signal 31 as data '0' and outputs the signal 32 as data '1'.

Here, the timer circuit 17 outputs a signal 18 as data '1' at the time when a signal 31 has been input as data '1' and after having counted the time data until the input which has been set beforehand in its own storage part, outputs the signal 26 as data '1'.

Figure 2:
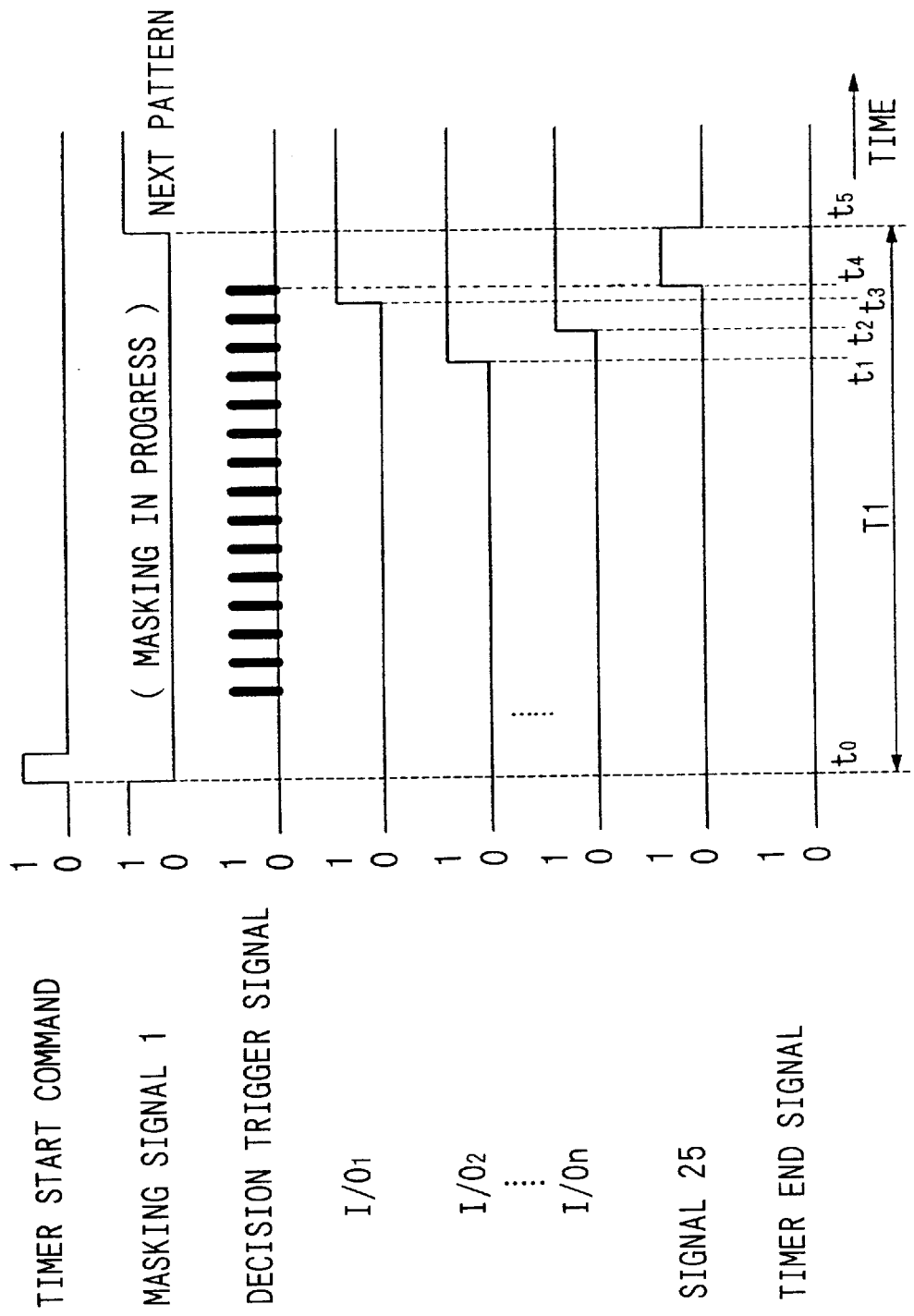
FIG. 2 is a timing chart showing the operation of the semiconductor testing equipment according to a preferred embodiment of the present invention.

Next, the operation of the preferred embodiment described above will be described with reference to FIGS. 1 and 2. FIG. 2 is a timing chart showing the changes in each signal when the devices under test 3, 3, . . . have become acceptable products within a time data set previously in the storage part of the timer circuit 17.

First, the pattern sequence control circuit 28 outputs the command pattern data to the command pattern matching circuit 29. As a result of this, the command pattern matching circuit 29 compares the data of this command pattern with the command data given from a control circuit, not shown in the figure, to the devices under test 3, 3, . . . with a timing of the scanning signal 6A.

Then, the command pattern matching circuit 29, as a result of the aforementioned comparison, assuming that these command patterns match, outputs the signal 31 (timer start command signal) as data '1' for starting the timer counting to the timer 17 at a time t0.

Whereupon, the timer circuit 17, at the same time as starting the counting operation of the time, outputs signal 18 (timer start signal) as data '1' to the mask control circuit 14. As a result of this, the mask control circuit 14 outputs signals 151 to 15n (masking signals 1) which respectively conduct masking control for the AND circuits 121 to 12n as data '0'.

Consequently, regardless of the output of the decision circuits 91 to 9n, the outputs of the AND circuits 121 to 12n respectively go to '0'.

At the same time, in order to enable the AND circuits 191 to 19n, signal 20 is output as data '1'. As a result of this, the AND circuits 191 to 19n, output '1' respectively, if the output data of the OR circuits 211 to 21n are '1'.

Next, the comparison results of the data from the devices under test 3, 3, . . . output and the data stored in comparison circuits 71 to 7n are sampled by the decision circuits 91 to 9n by a decision trigger signal which is periodically output as the signal 11 by a pulse generator, not shown in FIG. 1.

In other words, if the values of the signals 101 to 10n output from the comparison circuits 71 to 7n are '1', the corresponding data which the devices under test 3, 3, . . . output and the data which has been previously stored are regarded as matching, and these data are stored in the decision circuits 91 to 9n respectively.

Then, the decision circuits 91 to 9n output each signals 131 to 13n, which have been stored, to OR circuits 211 to 21n. Next, at a time t1, the value of the signal I/O1 goes to '1', and at a time t2, the value of the signal I/O2 goes to '1', . . . , at a time t3, and by so going, the value of the signal I/On goes to '1', thereby all of the devices under test 3, 3, . . . are considered to have output normal data.

As a result of this, all of the data output by the devices under test 3, 3, . . . become normal values, and since all of the values which are input into the input terminals have gone to '1' at a time t4, the AND circuit 24 outputs a signal 25 as data '1'. Thereupon, when once the data '1' has been input, the pattern sequence control circuit 28 initiates an interrupt operation and outputs a command data to the command pattern matching circuit 29.

Consequently, the command pattern matching circuit 29 outputs '1' as a signal 32 (reset signal), for example, to the mask control circuit 14. Then, the mask circuit 14 outputs signals 151 to 15n (masking signals 1) as data '1' and releases the masking operation. Then, a decision value processing circuit 16 records that the devices under test 3, 3, . . . are acceptable products.

At the same time, the mask control circuit 14 outputs a signal 20 (masking signal 2) as data '0' and masks the outputs of the AND circuits 191 to 19n. Here, since the test has been finished within a prescribed time, the timer circuit 17 does not output a timer end signal 26 to a signal line. Ultimately, the testing time of confirmation for data erase becomes a time T1, which is from time t1 to t5.

Figure 3:
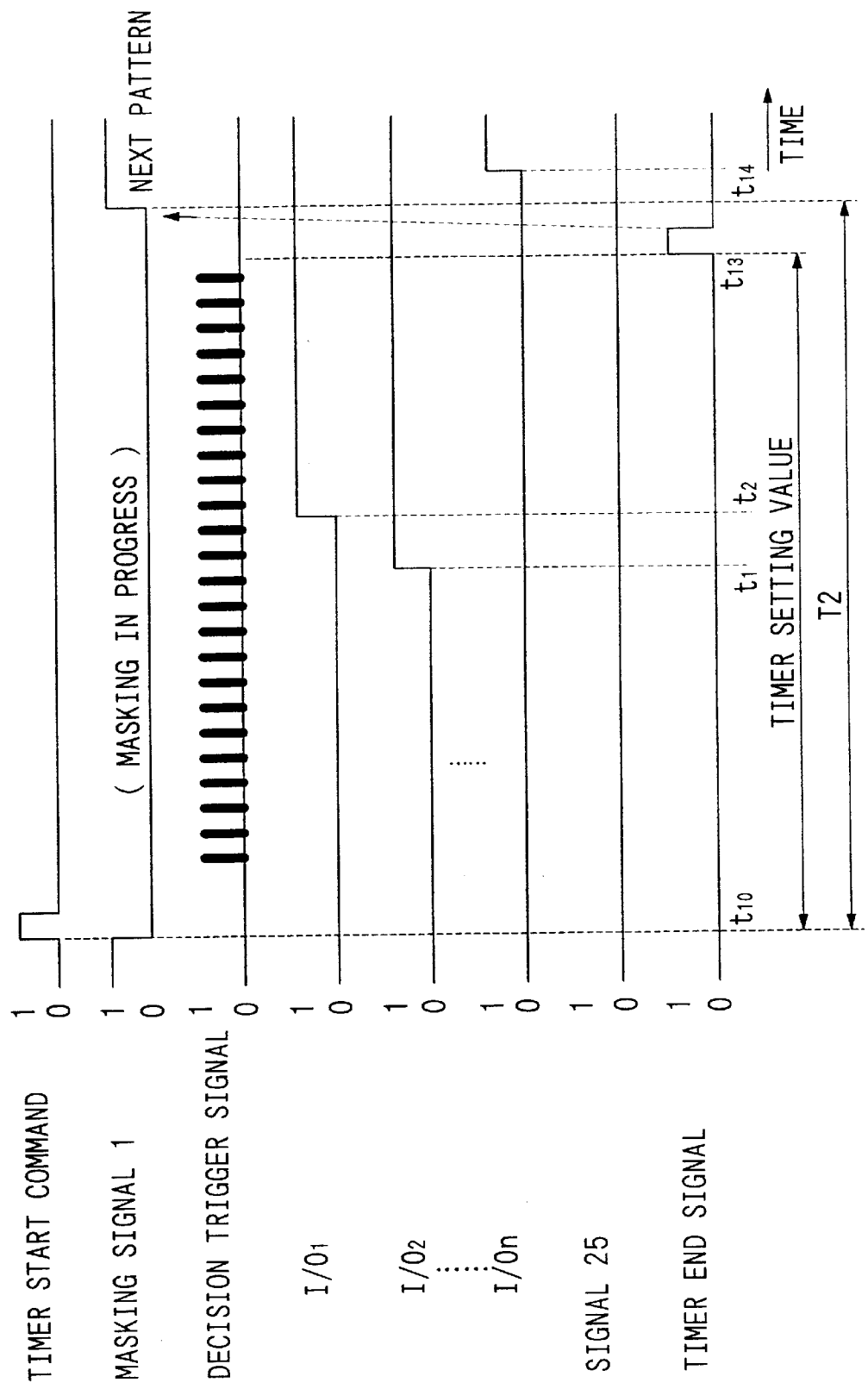
FIG. 3 is a timing chart showing the operation of the semiconductor testing equipment according to another preferred embodiment of the present invention.

Next, the operation of the preferred embodiment described in the foregoing sections will be described with reference to FIGS. 1 and 3. FIG. 3 is a timing chart showing the change of each signal, when the devices under test 3, 3, . . . do not become acceptable products within the time data prescribed beforehand in the storage part of the timer circuit 17.

First, the pattern sequence control circuit 28 outputs the command pattern data to the command pattern matching circuit 29. As a result of this, the command pattern matching circuit compares the data of this command pattern with command data given by a control circuit, not shown in the figures, to the devices under test 3, 3, . . . with a timing of the scanning signal 6A.

Then, as a result of the comparison aforementioned, the command pattern matching circuit 29, if these command patterns match as a result of the aforementioned comparison, outputs a signal 31 (timer start command) which initiates the clocking of the time as data '1', at time t10 to the timer circuit 17 via a signal line.

Now, the timer circuit 17, simultaneously to initiating the counting operation of the time, outputs a signal 18 (timer start signal) as data '1' to the mask control circuit 14.

As a result of this, the mask control circuit 14 respectively outputs signals 151 to 15n of the value '0' as the masking value to AND circuits 121 to 12n. From this, regardless of the output of the decision circuits 91 to 9n, the outputs of the AND circuits 121 to 12n respectively go to '0'.

At the same time, in order to enable the AND circuits 191 to 19n, signal 20 is output as data '1'. As a result of this, the AND circuits 191 to 19n output '1' if the output data of the OR circuits 211 to 21n is respectively '1'.

Next, in response to the trigger signal 11, the decision circuits 91 to 9n sample the comparison data output by the comparison circuits 71 to 7n.

In other words, if the data of the signals 101 to 10n are output from the comparison circuits 71 to 7n, it would mean that the data stored in itself and the devices under test 3, 3, . . . match, and these data are stored to respective decision circuits 91 to 9n. This signal 11 (decision trigger signal) is given periodically between the testing times previously prescribed from time t10 to t13.

Then, the decision circuits 91 to 9n output the data of signals 131 to 13n, which are to be stored, to each of the OR circuits 211 to 21n. Next, at time t11, the data of the signal I/O1 go to '1', at time t12, the data of I/O2 go to '1', . . . , and the data of the signal I/On-1 go to '1'.

However, prior to the signal I/On going to '1', the timer 17, at the time t13 when the time data set therein and the counted value match, outputs a signal 26 as '1' as a time end signal. As a result of this, the OR circuit 24 outputs a signal 27 as data '1'. From this, the pattern sequence control circuit 28, initiates the interrupt operation and outputs command data to the command pattern matching circuit 29, when the data '1' is input.

As a result of this, the command pattern circuit 29 outputs to the mask control circuit 14 via a signal line, for example data '1' as a signal 32 (reset signal). Thereupon, the mask control circuit 14 outputs signals 151 to 15n as data '1' and releases the mask operation.

Then, the decision value processing circuit 16 records that the devices under test 3, 3, . . . corresponding to the decision circuits 91 to 9n of the devices under test 3, 3, . . . are acceptable products. At the same time, the decision value processing circuit 16 records that the object device 3 corresponding to the decision circuit 9n is a defective product.

At the same time, the mask control circuit 14 outputs data '0' for the signal 20 and masks the outputs of the AND circuits 191 to 19n. Here, since the test has been completed within the prescribed time, the timer circuit 17 outputs a signal 26 to the pattern sequence control circuit 28 as a signal for timer completion.

Ultimately, the testing time for deciding the quality of the article becomes a time T2, from time t1 to t14. Here, the relationship between the time T1 and T2 becomes "T1<T2", and the time T1 becomes shorter with respect to the prescribed time T2.

Thereupon, the mask control circuit 14, in the testing of the timings for the scanning signal 6A, 6B or 6C, confirms the OR circuits 211 to 21n corresponding to the object device 3 which has been decided as being a defective product. Then, the mask control circuit 14 outputs respective signals 221 to 22n to the OR circuits 211 to 21n which have been confirmed corresponding to defective products with data '1' as dummy signals for acceptable products.

As a result of this, since the testing time for the data deletion can be conducted in the time T2, even when the dispersion of the testing times among the devices under test 3, 3, . . . are large, the possibility of reducing the testing time exists.

Figure 4:
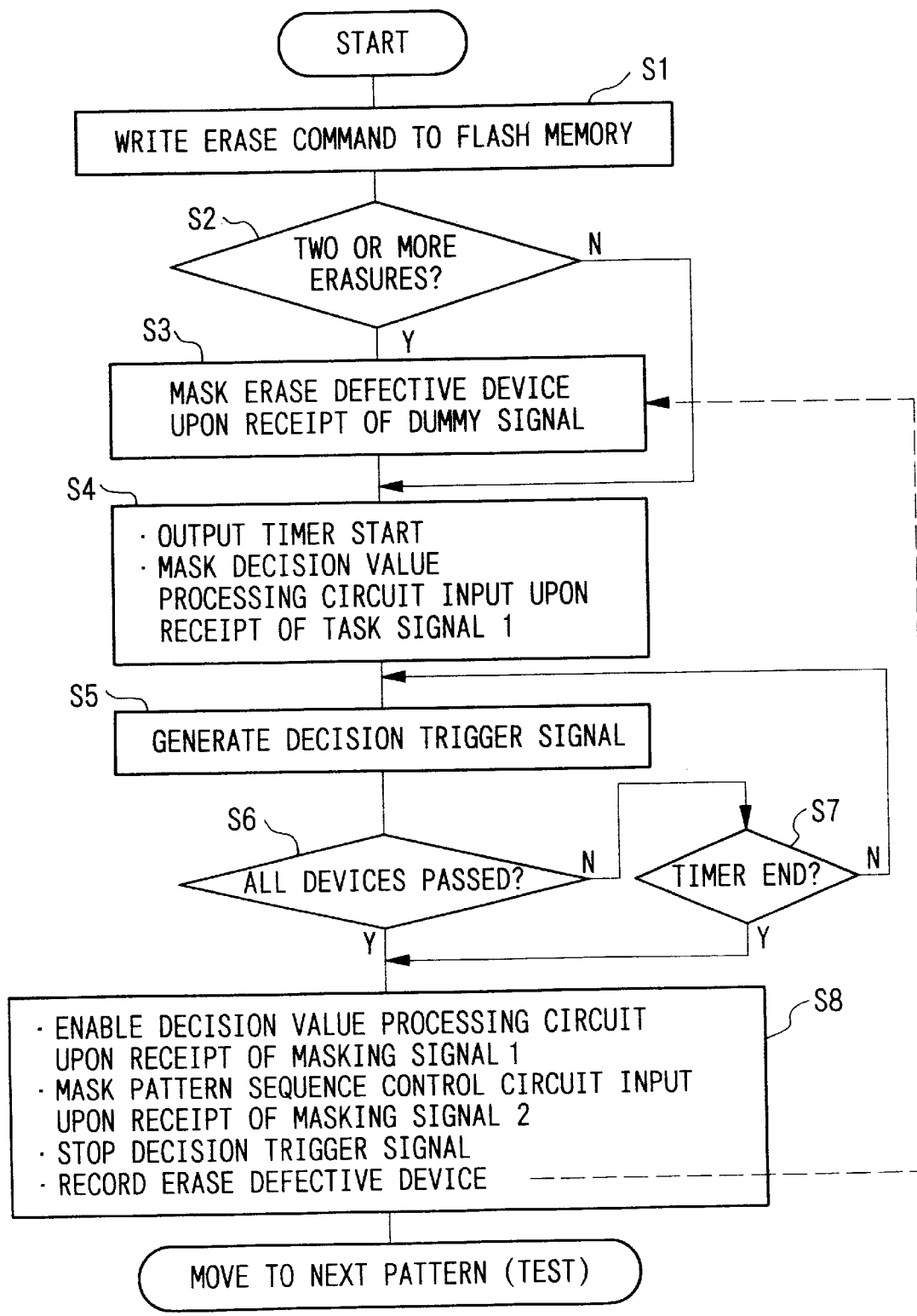
FIG. 4 is a flow chart showing the operation of the semiconductor testing equipment according to a preferred embodiment of the present invention.

Next, the case in which a preferred embodiment, shown in FIG. 1, is utilized for the test in data erase of flash memory will be described with reference to FIGS. 1 and 4.

Here, the devices under test 3, 3, . . . are flash memories, for which when the data which have been written are erased, the data of the signals I/O1 to I/On go to '1'.

The time data stored by the timer 17 is used as a reference for DUTs 3 that are shipped as acceptable products and indicates the time that the data on the specification sheets was erased.

In other words, since the data erase stored in the interior part of the device under test are not conducted within the time prescribed in the product specifications, the data stored within this time data are decided as being a defective product.

First, in step S1, the control circuit not shown in FIG. 1, writes an erase command to the devices under test 3, 3, . . . in the timing of the signal 6A. At the same time, the command pattern matching circuit 29, advances the process to step S2, when a similar erase command is input and matches the command data set beforehand within itself.

Next, in the step S2, the erase command given to the devices under test 3, 3, . . . confirms whether it is the first or more than a second time, by its own counter. As a result of this, when confirmation is made that the erase command given to the devices under test 3, 3, . . . is the first, the command pattern circuit 289 does not execute step S3 but rather advances the process to step S4.

Furthermore, in the step S2, the erase command given to the devices under test 3, 3, . . . is confirmed whether it is the first or more than the second time, by its own counter. As a result of this, the command pattern matching circuit 29 advances the process to step 3, when confirmation is made that the erase command given to the devices under test 3, 3, . . . is more than the second time.

Next, in the step S3, the command pattern matching circuit 29, based on the acceptable product/defective product data corresponding to the devices under test 3, 3, . . . searches for the devices under test 3, 3, . . . which have been decided as being defective, prior to the present test.

Then, the command pattern circuit 29 writes a command to the mask control circuit 14 to cause it to output a masking signal corresponding to the devices under test 3, 3, . . . which have become defective, via a signal line, not shown.

As a result of this, the mask control circuit 14, outputs masking signal '1' to the OR circuits 211 to 21n, corresponding to the devices under test 3, 3, . . . which have become defective products. In other words, this masking signal results in giving a dummy signal as acceptable products to the OR circuits 211 to 21n, corresponding to the devices under test 3, 3, . . . which have been decided as being defective products. As a result of this, the devices under test 3, 3, . . . which have been decided as being defective products no longer affect the output signals of the AND circuit 23.

Next, in step S4, the command pattern matching circuit 29, via a signal line, outputs a signal 31 (timer start command signal) to the timer start circuit 17. As a result of this, the timer circuit, along with initiating the counting operation, outputs a signal 18 (timer start signal) to the mask control circuit 14.

As a result of this, the mask control circuit 14, outputs the signals 151 to 15n as the masking signal 1 with data '0', with respect to each AND circuits 121 to 12n. At the same time, the mask control circuit 14 outputs the data of each signals 20 (masking signal 2) to AND circuits 191 to 19n as '1', via a signal line.

Next, in step S5, the mask control circuit 14 being in synchrony with the timing which outputs the masking signal with respect to the AND circuits 121 to 12n, the pulse generator not shown in FIG. 1, outputs a signal 11 (decision trigger signal) to each decision circuits 91 to 9n, until the output data of the AND circuit 23 periodically go '1'.

Next, in step S6, the pattern sequence control circuit 28, conducts confirmation as to whether the output of the AND circuit 23 is '1' or '0'. As a result of this, when the output data of the AND circuit 23 is '1', the pattern sequence circuit 28 confirms that no defective product appeared in the test conducted with a timing of pattern sequence 6A. Then, the pattern sequence control circuit 28, does not execute step S7, but instead advances to step S8.

Furthermore, if the output data for the AND circuit 23 is '0', in the timing for the decision triggering signal of this time, the pattern sequence circuit confirms that no acceptable product appeared, and advances to step S7.

Next, in the step S7, the pattern sequence circuit 28, confirms whether or not the counted value of the time is equal to the time previously set by the pattern sequence circuit 28. If the testing time has ended, the pattern sequence control circuit 28, advances the process to step S8.

However, when it is not the prescribed testing time, in either of the steps S6 or step S7, the pattern sequence circuit 28 returns to the step S5, until the output data of an OR circuit 24 become '1'. Then, the pattern sequence control circuit 28 repeats decisions of the output for the OR circuit 24 with step S6 and step S7 each time the decision trigger signal is output. Here, suppose that the timer circuit 17 has output a signal 26 (time end signal). From this, the pattern sequence control circuit 28, outputs the signal 32 (reset signal) to the mask control circuit (step S8).

As a result, the mask control circuit 14, releases a mask with respect to the AND circuits 121 to 12n, setting the data of the signals 151 to 15n of the AND circuits 121 to 12n. At the same time, the mask circuit 14 masks each of the AND circuits 191 to 19n, setting the data of the signal 20 (masking signal 2) as '0'.

At the same time, a pulse generator not shown in FIG. 1, stops the output of a signal 11 for the decision trigger signal. Then, a decision value processing circuit 16 records the devices under test 3, 3, . . . and the devices under test 3, 3, . . . which became acceptable products. As a result of this, the semiconductor testing equipment 1 moves to the next test.

As described in the foregoing sections, when testing has been executed once with respect to erasing, the mask control circuit 14 masks the decision for the devices under test 3, 3, . . . which have been decided as being defective. As a result of this, in the erasing test after the second time, the result of the decision of the device to be tested which have been designated as being defective may be made invalid.

As a result of this, in the characteristics testing in which identical decision process is conducted two or more times, it is not necessary to wait for the confirmation until the prescribed decision time, thereby enabling reduction in the decision process time and significantly reducing the overall testing time.

What is claimed is:

1. Semiconductor testing equipment for testing integrated circuits, the testing equipment comprising:

a timer that is set to a specified time interval;

comparison circuits that compare previously-stored data with data output from a respective one of a plurality of integrated circuits, and output a comparison signal based on the comparison;

a decision timing circuit that determines when a specified time interval has elapsed or when all the comparison signals indicate acceptable products before the specified time interval has elapsed, and provides a timing signal when at least one of those events occurs;

a decision circuit that performs data processing of the comparison signals in response to the timing signal;

a changing circuit that is interposed between said comparison circuits and said decision timing circuit, and that outputs a signal indicating a defective semiconductor device to the decision timing circuit, wherein the signal output by the changing circuit is interpreted as an acceptable product signal; and a mask control circuit that, during subsequent testing, outputs a comparison signal corresponding to the defective semiconductor device as a dummy signal, and based on the dummy signal, said changing circuit outputs to said decision timing circuit a comparison signal for the defective semiconductor device that is interpreted as an acceptable product signal.

2. Semiconductor testing equipment according claim 1 wherein said changing circuit includes an OR circuit that performs an OR operation with respect to said dummy signal and the comparison signal from the changing circuit.

* * * * *